United States Patent
Vashchenko et al.

(10) Patent No.: US 6,956,269 B1
(45) Date of Patent: Oct. 18, 2005

(54) SPIN-POLARIZATION OF CARRIERS IN SEMICONDUCTOR MATERIALS FOR SPIN-BASED MICROELECTRONIC DEVICES

(75) Inventors: Vladislav Vashchenko, Palo Alto, CA (US); Michael Mian, Livermore, CA (US); Peter J. Hopper, San Jose, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 10/744,252

(22) Filed: Dec. 22, 2003

(51) Int. Cl.[7] .............................................. H01L 29/82
(52) U.S. Cl. .................... 257/421; 257/252; 257/427
(58) Field of Search ........................... 257/252, 421, 257/427

(56) References Cited

U.S. PATENT DOCUMENTS

| | | | |
|---|---|---|---|
| 4,982,248 A * | 1/1991 | Laibowitz et al. ............ 257/77 |
| 5,206,590 A * | 4/1993 | Dieny et al. ................. 324/252 |
| 5,652,445 A * | 7/1997 | Johnson ....................... 257/295 |
| 5,654,566 A * | 8/1997 | Johnson ....................... 257/295 |
| 6,297,987 B1 * | 10/2001 | Johnson et al. ............. 365/158 |
| 6,313,539 B1 * | 11/2001 | Yokoyama et al. ......... 257/761 |

* cited by examiner

Primary Examiner—Allan R. Wilson
(74) Attorney, Agent, or Firm—Stallman & Pollock LLP

(57) ABSTRACT

Spin-based microelectronic devices can be realized by utilizing spin-polarized ferromagnetic materials positioned near, or embedded in, a semiconductor channel of a microelectronic device. Applying an electric field across the channel can cause carriers flowing through the channel to deviate toward one of the ferromagnetic materials, such that the spin of the carriers tends to align with the spin polarization of the respective material. Such a process allows for the controlled spin-polarization of carriers in a semiconductor channel, and hence the development of spin-based microelectronics, without having to inject spin-polarized carriers from a ferromagnet into a semiconductor channel. Such a process avoids the Schottky barrier problem plaguing existing approaches to spin-based microelectronics, while allowing the devices to be based on silicon substrates that are well-known and used in the industry.

20 Claims, 7 Drawing Sheets

SPIN-POLARIZATION OF CARRIERS IN SEMICONDUCTOR MATERIALS FOR SPIN-BASED MICROELECTRONIC DEVICES

TECHNICAL FIELD OF THE INVENTION

The present invention relates to the use of spin-injection in silicon-based microelectronic devices.

DETAILED DESCRIPTION

Figure 1:
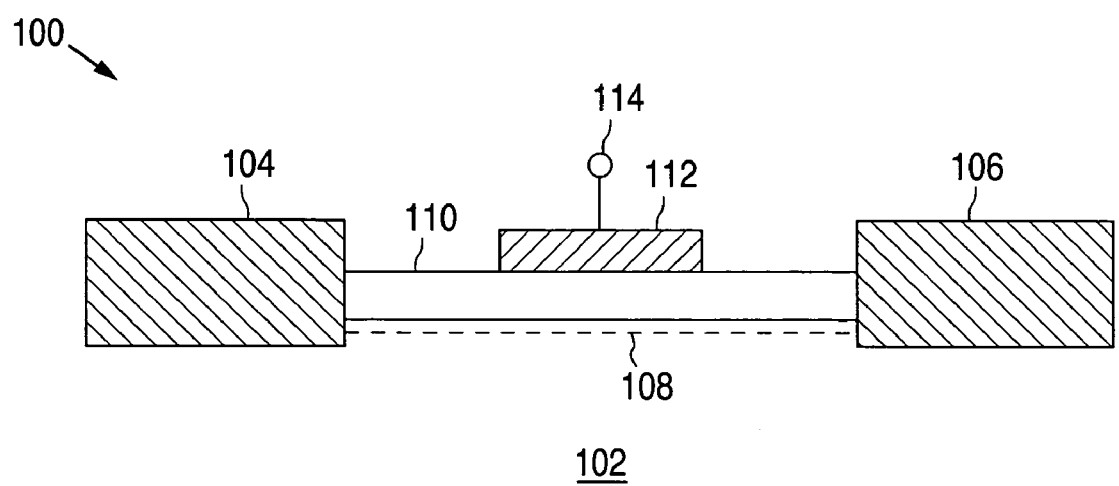
FIG. 1 is a diagram of a proposed spin-FET in accordance with one approach of the prior art.

As demands placed on semiconductor devices continue to increase, there is a corresponding need for higher density devices having feature sizes that push further into the submicron level. In order to address the necessary increases in density, design engineers have begun to look to the quantum level, designing devices known in the industry as spin-based electronic or "spintronic" devices. Spintronic devices utilize the spin of an electron, rather than simply relying on the movement of charge through a device. There is a magnetism associated with the angular momentum or spin of an electron, and the energy of the electron in a magnetic field depends on the orientation of a spin "vector" associated with the spin. While each electron has the same amount of spin, electron spins have vectors pointing in random directions in an ordinary electric current. These random directions do not affect the resistance of the circuit or device containing the current.

When these electrons are exposed to a magnetic field, the electron spin vectors tend to orient themselves either parallel or anti-parallel to the magnetic field. This effect is referred to as the electrons having either a spin "up" or spin "down," referring to the vector associated with the spin of each electron as is known in the art. Further, the electrons in a ferromagnet tend to "align" themselves with adjacent electrons such that the spin vectors on average point in the same direction. Electrons having a spin up or spin down can be easiest understood as being said to have axes of rotation that are parallel, but that have opposing directions of rotation. When a flow of current passes through a ferromagnet, electrons of the same spin orientation as the ferromagnet tend to flow freely, while electrons of the opposite spin tend to be obstructed. The result is a current comprised of electrons having predominantly the same spin orientation.

Presently, people are utilizing magnetics and the magnetoresistive effect in areas such as high density hard drives. Such technology utilizes thin films for high density recording using a magnetic recording head, acting as a spin valve, instead of coils for charge detection as was done previously. The utilization of thin films allows devices to move to the micro- or nano-scale. Existing charge-based electronics typically ignore the spin of the electrons in the current flow. A rapid pace of discoveries based on the Giant Magnetoresistive Effect (GMR) has virtually revolutionized the multibillion dollar industry of magnetic hard drives, introducing affordable high-density drives (HDD). Recent discoveries in this area have made further progress, pushing the magnetic recording industry on the order of four times beyond the previously-acknowledged physical limit. In another new class of devices, magnetic memory is commercially available that is based on GMR concepts. Information on GMR can be found through many sources, such as at the IBM Research Web site.

A huge amount of research activity also has been devoted to the creation of other spin-based devices. The potential for microelectronics with spin-dependent effects includes rapid progress in non-volatility, data processing speed, electric power consumption, integration densities, and the development of totally new devices such as spin-FETs, spin-LEDs, spin-RTDs, optical switches, terahertz frequency modulators, and quantum bits. Complex problems exist, however, that must be addressed and overcome before such semiconductor spin-based devices can be realized. These problems include, for example: transport across hetero-interfaces, optimization of electron spin lifetimes, and the detection of spin coherence.

One device that has been proposed is a spintronic field-effect transistor (FET) as shown in FIG. 1. As in a conventional FET, a voltage from a voltage contact 114 is applied to a gate electrode 112 positioned above a semiconductor channel located between a source electrode 104 and a drain electrode 106. In a conventional FET, the applied voltage can cause electrons flowing between the source and the drain to be driven out of the semiconductor channel, thereby creating an insulator out of the channel. In a proposed spintronic FET, or "spin" FET, a ferromagnetic material such as iron can be used to form both the source 104 and the drain 106 of the FET device, such that current flowing through the semiconductor channel, such as along path 108, is primarily spin-polarized. In these previously proposed spin-FET devices, the substrate is not a simple silicon substrate as is commonly utilized and is well-known in the industry. Instead, various dopants are utilized in the substrate 102 and/or the intermediate layer 110 in order to attempt to obtain a working device, the dopants including, for example, indium, aluminum, arsenic, and gallium.

Spintronic devices such as spin FETs have yet to be fully realized, however, as injecting a spin-polarized current from a ferromagnetic material into a semiconductor material such as silicon has proven to be extremely difficult. The flow of electrons between such materials creates a Schottky-barrier type problem, or Schottky contact as is known in the art, wherein the transport of carriers through a Schottky contact changes the spin polarization of those carriers. In an attempt to avoid these difficulties, research currently is being done to create magnetic semiconductors by doping semiconductor crystals, such as by doping silicon with materials such as manganese. While such devices may eventually prove to be effective, such an approach would require a fundamental change in the way semiconductors are designed and manufactured, as the industry as a whole is based on silicon wafers. While magnetic semiconductors may have problems or aspects which are presently undiscovered, silicon is well-studied and well-known. It is therefore desirable to develop a spintronic device using a standard silicon wafer or silicon substrate, along with existing semiconductor processes and devices.

Systems and methods in accordance with embodiments of the present invention can overcome these and other deficiencies in existing spintronic approaches to microelectronic devices by utilizing novel spin filtering mechanisms which allow carriers to be spin polarized after being injected into a silicon semiconductor channel, such that existing problems with spin injection can be avoided. Since spin detection problems are significantly less severe than spin injection problems, ferromagnetic detection contact structures easily can be used to detect spin-polarized carriers. These detection contacts can change "resistivity" based upon the polarization of the carriers flowing through the channel to the detection contact, as a ferromagnetic detection contact will resist the flow of anti-parallel polarized carriers. Such devices do not require the formation and inclusion of p-n junctions, and are capable of conducting current at a very low voltage.

As discussed above, current flowing from a ferromagnetic source contact will have a primary spin polarization, or a non-equal distribution of carriers polarized in a particular direction. The proportion of carriers polarized in the particular direction, as well as the particular direction itself, can depend on factors such as the structure and purity of the contact, as well as the presence or application of a magnetic field. If a ferromagnetic drain contact has the same spin orientation as the source contact, the spin-polarized current will tend to flow easily from the source, through the semiconductor channel, and into the drain.

Figure 2:
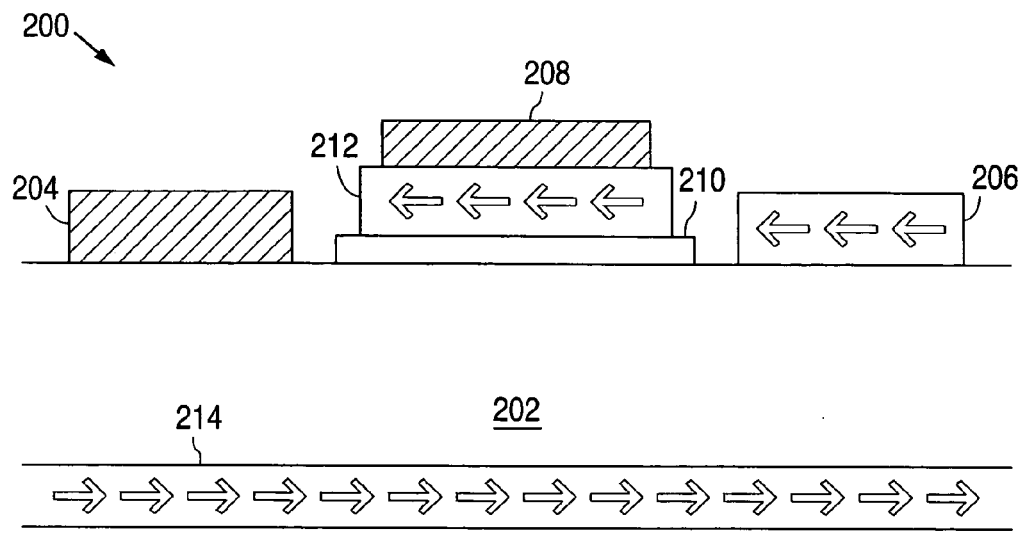
FIG. 2 is a diagram of a spintronic device in accordance with one embodiment of the present invention.

FIG. 2 shows an exemplary microelectronic device 200 in accordance with one embodiment of the present invention. In this device, a layer of silicon 202 has disposed thereon a source electrode or injection contact 204, a drain electrode or detection contact 206, and a gate electrode 208 as is known for a FET device. In this device, however, the detection contact 206 is made of a ferromagnetic material having a predetermined spin polarization. In order to obtain the spin-polarization, and depending on the process and parameters used to create the ferromagnetic contact, a very slight anneal might be necessary. A sufficiently large magnetic field also can be applied to the ferromagnetic contact 206 in order to properly spin-polarize the contact.

The gate electrode 208 is positioned on a ferromagnetic layer 212 overlying a thin oxide layer 210. There also can be a thin layer of oxide (not shown) between the gate electrode 208 and the ferromagnetic layer 212. Another layer of ferromagnetic material 214 can be embedded in the device on the side of the semiconductor channel opposite the gate electrode 208. A ferromagnetic layer can be embedded in the device using techniques known and used for embedding ferromagnetic materials in devices such as GMR devices and magnetic media devices. If the layers of ferromagnetic material are sufficiently thin, the spin polarization can align in a direction parallel to the surface of the device, as shown, without the need for "programming" of the spin. In such a device, it can be important that ferromagnetic layers 212 and 214 have different spin orientations, if not anti-parallel spin orientations as shown. These layers, or polarization regions, can be used as described herein to filter, or spatially polarize, the current passing through the channel.

Figure 3:
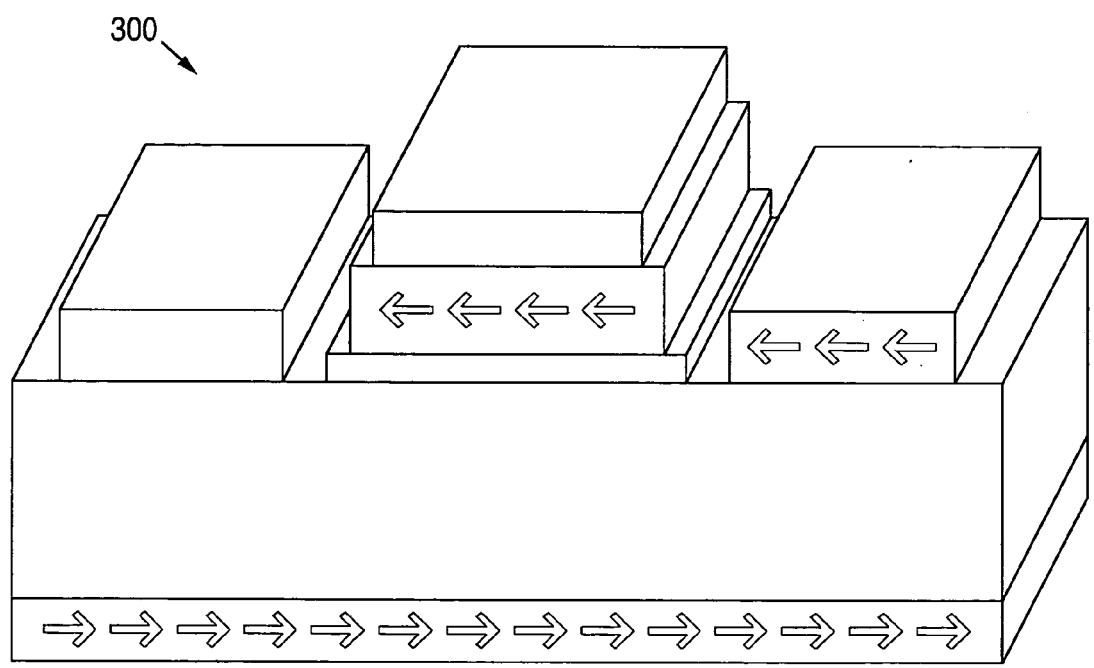
FIG. 3 is a perspective view of another spintronic device in accordance with the embodiment of FIG. 2.

FIG. 3 shows a perspective view of the device of FIG. 2. If multiple devices are to be formed from a single substrate, such as a silicon wafer, the substrate can undergo a shallow trench isolation (STI) process as is known in the art, wherein trenches are created in the wafer surface, such as by a dry-etch step, and filled with silicon oxide, such as through use of a chemical vapor deposition (CVD) process. After the overlying oxide is stripped from the surface, the trenches can be filled with silicon oxide to serve as isolation regions near an area of silicon for containing the device(s). These isolation regions can electrically isolate the devices, such as transistors, formed in or on the substrate. Any number of devices can be formed on a single wafer, the number being limited only by process and/or physical limitations. Further, the mechanism for diverting current flow near a ferromagnetic region in order to provide spin polarization can vary between devices on a wafer, can vary between wafers, and/or can vary between processes. In one embodiment, an external magnetic field can be applied across a semiconductor channel, instead of applying a bias to the gate electrode in order to generate a field across the channel to divert the carriers. In another embodiment, a nanowire can be used to apply a diverting field across the channel. In still another embodiment, a source of light can be used to divert the flow of carriers. The ferromagnetic regions can be positioned or created at any position in a device by which carriers can be diverted for spin-polarization purposes. The regions can be implant regions, layer regions, coating regions, or any other appropriate regions in a device. The diversions need not take place in a semiconductor channel, but can occur at any place in a device where a spin-polarized current flow can be used advantageously.

While two ferromagnetic regions can be appropriate for many devices, it should be understood that any number of such ferromagnetic regions can be used for spin-polarization purposes. If a device has sufficient detection sensitivity, for example, a single ferromagnetic region can be used to spin-polarize carriers. If a single region is used, carriers will either have a dominant spin-polarization or a random spin-polarization. If enough carriers are detected, the randomness of the non-polarized carriers should average to a given range that is outside the range of the polarized carriers, such that the difference can be accurately detected. An advantage to using a single ferromagnetic region is that it can simplify the device. For example, only layer 212 or 214 would need to be created in the device of FIG. 2, and could be selected depending upon which was easier to manufacture, cheaper, and/or more reliable in the particular device. It should also be understood that more than two regions can be used to precisely spin-polarize the carriers. These additional regions can be used to more precisely control spin ratios. In one example, a flow might be diverted near two regions in order to attempt to obtain a flow that is 67% spin up and 33% spin down. In another example, a flow might be diverted near two regions in order to obtain a flow that is 98% spin up, where deviating the flow near a single region might only result in a flow that is 88% spin up. These exemplary values are used for explanation purposes and are not meant to be interpreted as limitations on the respective devices.

Figure 4:
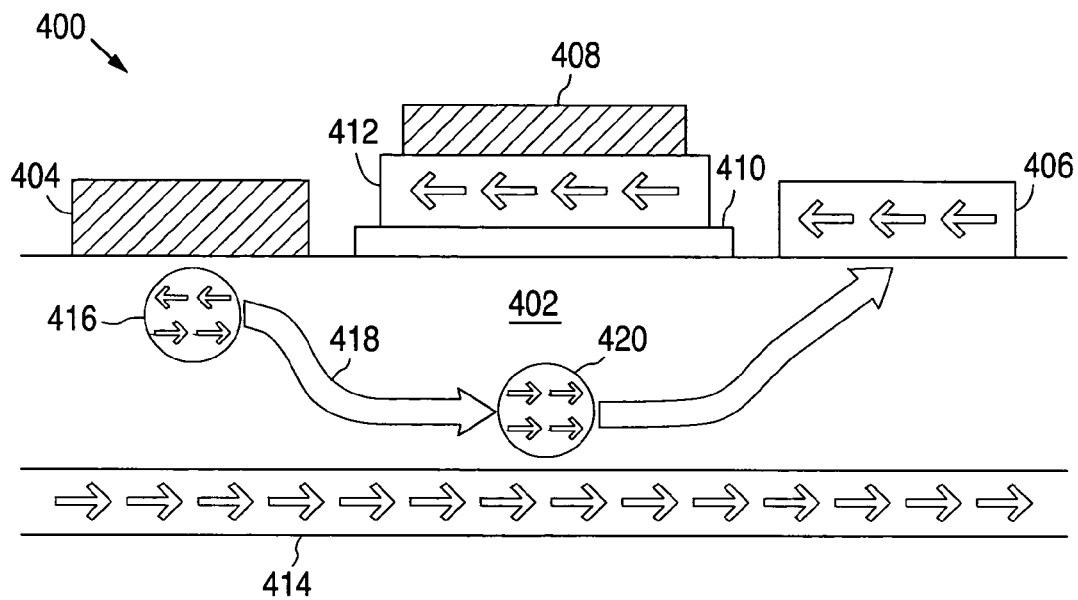
FIG. 4 is a diagram of a detection structure in accordance with the embodiment of FIG. 2.

FIG. 4 shows such a device 400 in operation. In the device, the cathode or source electrode 404 can inject carriers 416 into the silicon layer 402. The carriers will tend to flow toward the drain electrode, or detection contact 406, through the semiconductor channel. If a negative gate voltage is applied to the gate electrode 408, the current flow 418 will tend to move away from the gate electrode 408 as a result of the negative gate bias. In moving away from the gate electrode, the current flow can be redirected toward to the embedded layer of ferromagnetic 414. As carriers 420 pass sufficiently near ferromagnetic layer 414, the spin polarization of the carriers will tend to align with the spin polarization of the layer 414. Using this approach, the carriers 420 can be "programmed" to have a predominant spin polarization, without having undergone a spin injection at a Schottky contact between the cathode 404 and the silicon, as would be necessary in existing spin-FET approaches. Since the carriers 420 are spin polarized "opposite" to the spin polarization of the ferromagnetic detection contact 406 in this example, the resistance of the detection contact will be high, and the current will not flow easily into the detection contact. In this way, the semiconductor channel acts as an insulator as in existing FET devices, but can be switched more quickly and with less power.

Figure 5:
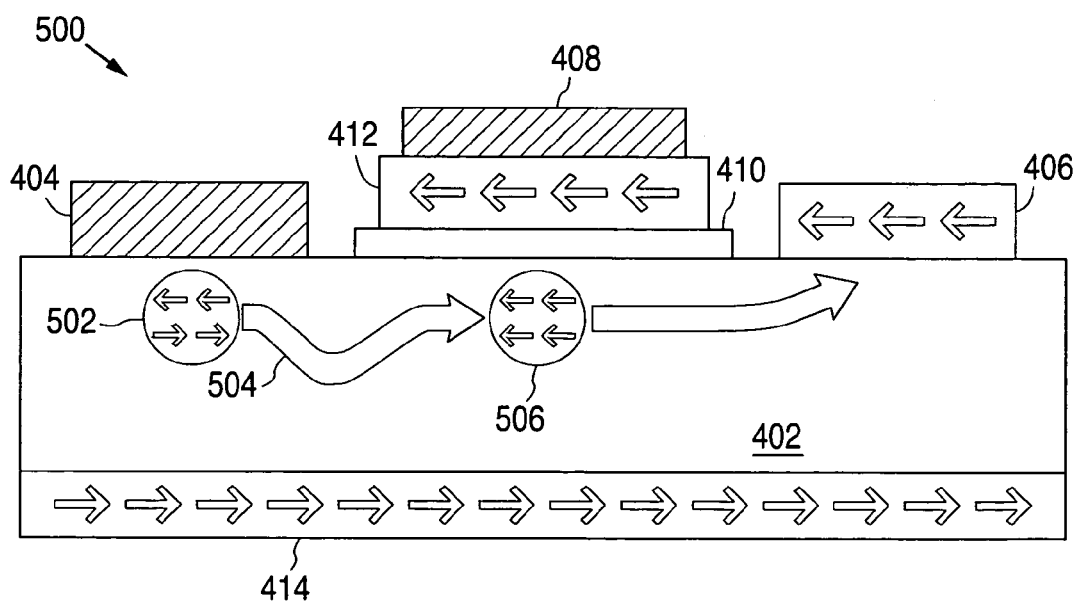
FIG. 5 is another diagram of a detection structure in accordance with the embodiment of FIG. 2.

FIG. 5 also shows such a device 500, wherein a positive gate bias is applied to the gate electrode 408. In this case, the carriers 502 injected into the silicon follow a charge flow 504 that passes near the gate electrode and ferromagnetic region 412, due to the electric field from the positive bias. The carriers 506 near region 412 can primarily align spins with ferromagnetic region 412, such that the current will easily flow into detection contact 406, which will have a low resistance to carriers having primarily the same spin polarization.

As discussed above, such approaches can avoid Schottky barrier problems, yet allow use of standard semiconductor technology such as silicon wafers. Ferromagnetic materials such as cobalt and nickel can have all the desirable properties of a metal, such that they can be used for ferromagnetic implant regions and for ferromagnetic detection contacts. The silicon substrate can utilize a layer of carrier material, such as for example an n-well in a p-substrate as is known in the art. The ferromagnetic regions can be positioned on opposite sides of the carrier material, or can be placed within the carrier material if the bias voltage is sufficiently capable of diverting the current flow near those regions in order to spin-filter the carriers. The cathode can be a standard cathode as known in the art, while the detection contact can be made of a ferromagnetic metal, such as cobalt or nickel, which in the above example has a spin polarization that is parallel to the surface of the silicon substrate. The magnetization of the detection contact can depend in part on the thickness of the contact. An external magnetic field can be applied to each contact in order to program the spin orientation of the contact, if necessary. Each ferromagnetic contact can have a plug positioned thereon, such that the contact can be placed in communication with an overlying metal layer (not shown) as is known in the art. If necessary, a layer of interface material can be positioned between the detection contact and silicon in order to minimize loss of spin at the barrier between the two materials. The interface material can be sufficiently thin, such that spin-polarized carriers can flow into the detection contact without losing spin polarization.

The gate electrode or polygate, positioned on or near one of the ferromagnetic regions, can be used to apply an electrical field across a semiconductor channel in the carrier layer between the cathode and detection contact. The gate electrode, along with circuitry necessary to apply the electric field to the channel, can function as a control mechanism capable of providing control over the spin polarization of injected carriers flowing through the semiconductor channel.

As mentioned, the spin polarization of the carriers can affect the resistance of the detection contact. As seen in FIG. 5, when the spin of the carriers is primarily the same as the spin polarization of the detection contact, the detection contact will have a relatively low resistance and current will easily flow into the detection contact along current flow direction 504. As shown in FIG. 4, when the primary spin of the carriers is opposite to, or at an angle relative to, the spin polarization of the detection contact, the detection contact will have a higher resistance and current will not as easily flow into the detection contact. When carriers are primarily spin polarized in a non-parallel direction, such as at an angle or orthogonal to the spin orientation of the detection contact, the effective resistance of the detection contact can vary but current can still flow into the detection contact. FIGS. 4 and 5 show exemplary directions of current flow in these devices. The angles shown are exaggerated, as the angle of approach of the current to the detection contact can be a relatively small angle.

Many control methods are known for applying an electric field to a channel in a semiconductor device such as a FET. Many of these control methods can be applied to spin FETs and other devices on silicon in accordance with embodiments of the present invention. Similar devices can be created using different approaches to controlling the spin polarization of the injected carriers. In one such device, a magnetic transistor can be created using a nanowire polygate to provide and control a magnetic field that can be used to control the spin polarization of the carriers. In another such device, a ferromagnetic gate can be used that has a spin polarization, such that the application of a voltage to the gate can cause a carrier passing by the gate to align spin with the gate. These devices also can include other components, such as magnetic sensors, and can be positioned near an associated integrated circuit. The realization of spin-polarized electron flow can be further used for modulated light emission in devices such as spin-LEDs. Other devices using such spin-polarized electron flow can be manufactured accordingly, which can benefit from the non-charge based approach to microelectronics.

Figure 6:
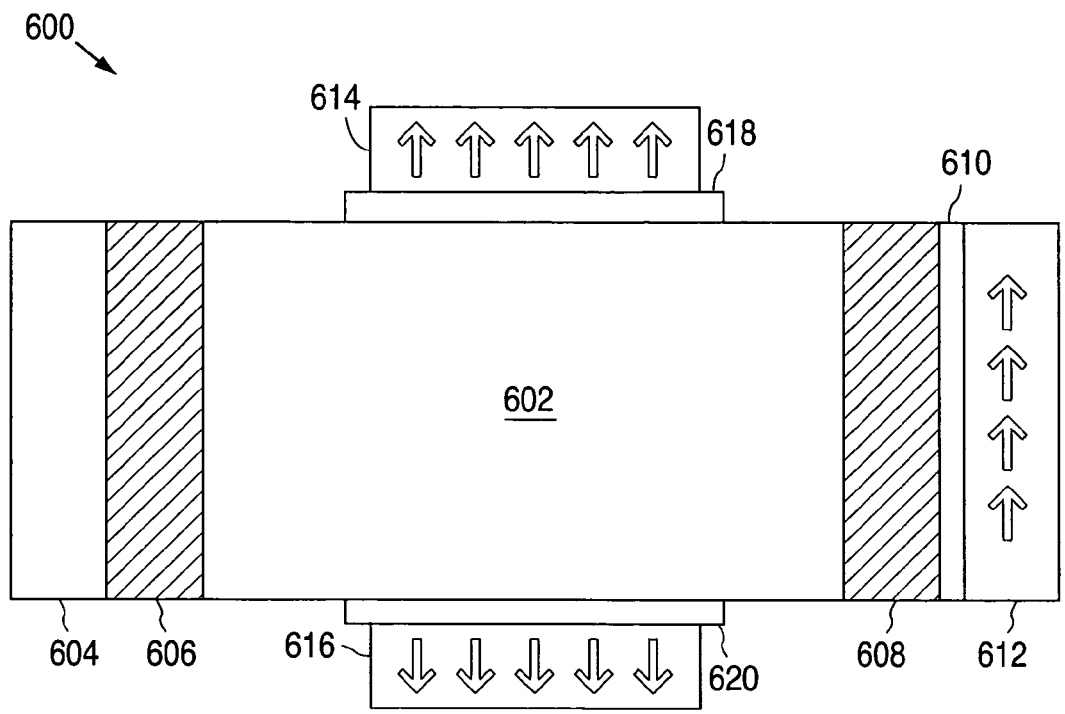
FIG. 6 is a diagram of a detection structure in accordance with another embodiment of the present invention.

FIG. 6 shows another spin-based device 600 in accordance with embodiments of the present invention. As opposed to the layered structure in the device of FIG. 3, which can extend upward out of a silicon substrate, for example, the device of FIG. 6 utilizes a single layer approach that can be built across the surface of a silicon wafer, for example. In this exemplary device, a silicon layer region 602, such as an n-well or n-body, is deposited on the silicon wafer to act as a carrier layer. A cathode or injection contact 604 is positioned at one end of the silicon layer 602 or carrier region, with an n+ region 606 positioned between the silicon layer 602 and the cathode 604. The n+ region 606 can be used to provide ohmic contact between a silicon layer and an electrode, but is not necessary in many embodiments. For materials other than silicon, or for heavily doped materials, for example, other regions and/or materials can be used to provide ohmic contact where necessary. At the other end of the device, a ferromagnetic anode or detection contact 612 is positioned near the silicon layer 602, separated from the layer by an interface region 610 and another n+ region 608. The detection contact can detect the level of spin polarization in the current using principles similar to those in GMR-based devices. The detection contact 612, which can also serve as a magnetic valve contact, has a primary spin polarization that is parallel to the silicon interface in this example. The cathode and ferromagnetic contact can be formed from materials such as those described with respect to the device of FIG. 2.

The interface region 610 can be of any appropriate material, such as a thin layer of silicide, which can create good ohmic contact between the silicon 602 and the ferromagnetic contact 612. Silicides are known in the art for serving as an interface between, for example, silicon and a tungsten plug, thereby creating an interconnect region to a metal level of the semiconductor. Silicide layers, particularly layers of self-aligned silicide, have been used in devices such as high-performance CMOS devices. These silicide layers can provide a low sheet resistance of source, drain, and gate electrode areas, minimizing RC delays and enabling high-speed operation. Such silicides can also be used to create stable contacting structures of low resistance, thereby minimizing undesired source/drain resistance and optimizing device performance. A metal such as titanium is typically deposited on a silicon surface and annealed in order to form the silicide layer. The entire metal layer can be reacted with the silicon and transformed into a silicide On the sides of the silicon layer 602 are positioned two ferromagnetic metal regions 614, 616. These regions are each separated from the silicon layer by a thin layer of oxide material 618, 610. The ferromagnetic regions 614, 616 have different spin polarizations, such that they can act as filtering regions for carriers flowing through the silicon layer 602. The ferromagnetic regions also can act as gate electrodes, such that a gate bias can be applied in order to generate an electric field across the silicon layer 602. As the entire silicon layer 602 can act as a carrier layer in this arrangement, the path of any current flowing through the silicon layer between the cathode 604 and detection contact 612 can be deviated by the presence of the electric field. Only a small voltage level, such as a small fraction of a volt, is needed to make such a device operable, as no p-n junctions need be included in the device.

Figure 7:
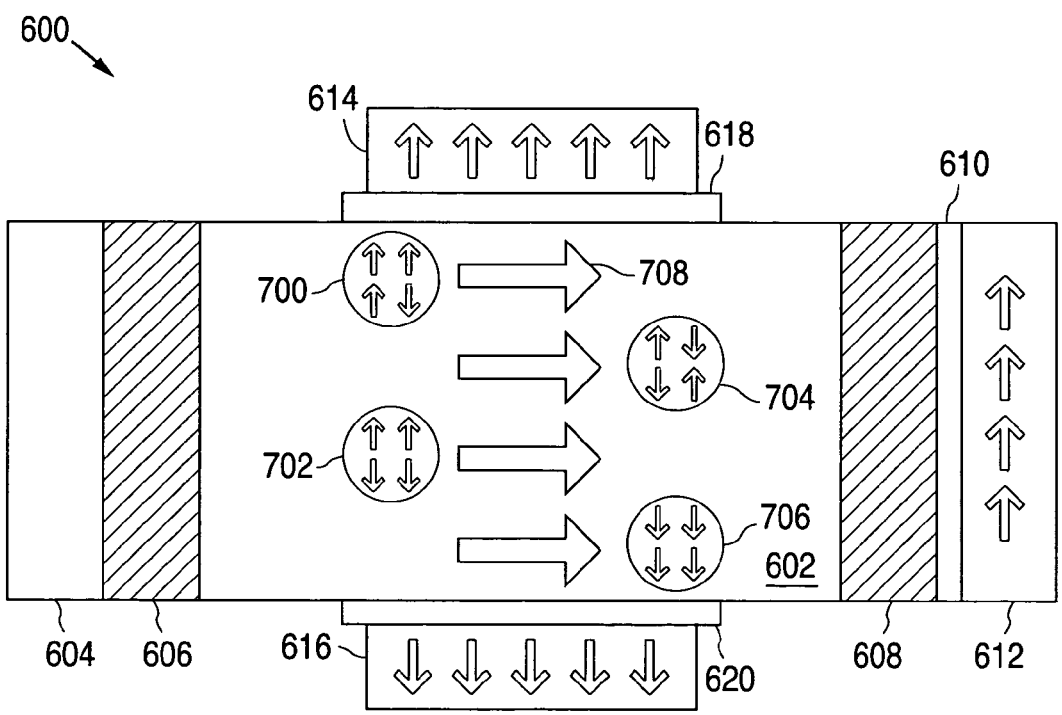
FIG. 7 is a diagram of a detection structure in accordance with the embodiment of FIG. 6.

FIG. 7 shows the operation of the device 600 of FIG. 6 without the application of a bias voltage capable of deviating current flow. The direction of current flow 708 can generally be fairly linear from the cathode 604 to the detection contact 612. Carriers injected into the silicon layer 602 from the cathode will generally have a random spin orientation. The carriers can switch spin alignment while passing through the carrier layer, however, depending on the proximity of the carriers to one of the ferromagnetic gate electrodes 614, 616. Carriers 700 passing close to gate electrode 614, with the electrode having spin "up" in the Figure, will tend to align themselves with the electrode to have a spin "up." These carriers can flow easily into the similarly polarized detection contact 612. Carriers 706 that pass near gate electrode 616, with the electrode 616 having spin "down" in the Figure, will tend to align themselves with the electrode to have a spin "down." These carriers will not flow easily into the polarized detection contact 612, as the carriers predominantly will have a spin opposite to that of the detection contact 612. Carriers 702, 704 passing through a central region between the gate electrodes 614, 616 can experience little to no spin adjustment. Alternatively, any adjustment of spin can be relatively balanced such that there is no dominant spin polarization to these carriers on average. These central carriers can flow into the detection electrode with varying degrees of ease. The resistance of the detection contact 612 can be an intermediate resistance, as the number of carriers with spins aligned with the contact can about equal the number of carriers with anti-aligned spins.

Figure 8:
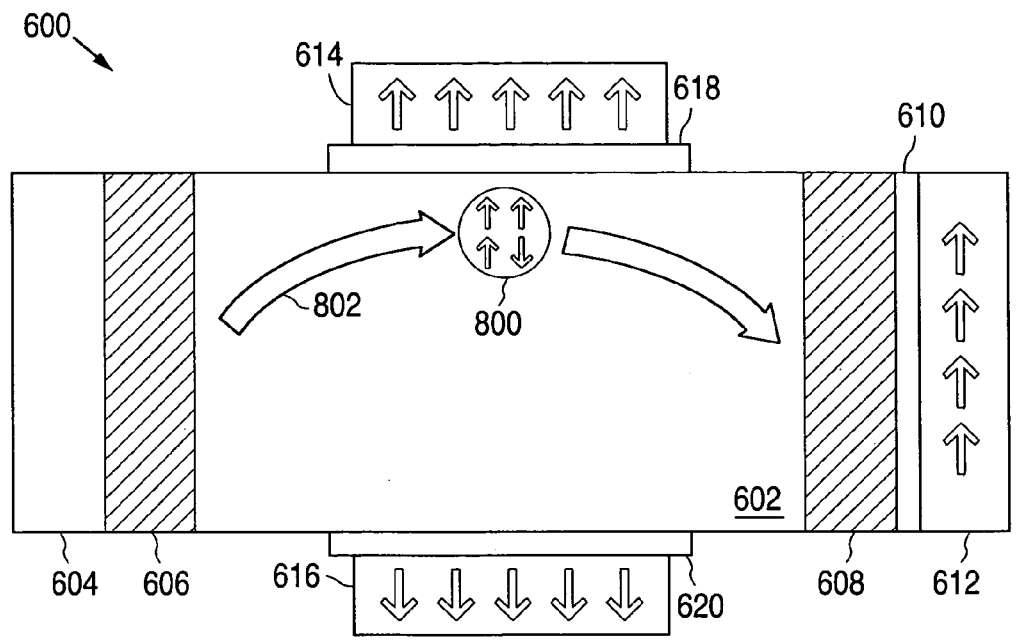
FIG. 8 is another diagram of a detection structure in accordance with the embodiment of FIG. 6.

FIG. 8 shows the device 600 with a positive gate bias being applied to gate electrode 614 and either no gate bias, or a negative gate bias, applied to gate electrode 616, such that the current flow 802 of carriers 800 in the carrier layer 602 will tend to deviate toward gate electrode 614. The closer the carriers 800 pass to gate electrode 614, the more the carriers will tend to align spin with the electrode, which is polarized spin "up" in this example. The carriers reaching the detection electrode 612 will have an average spin polarization favoring a spin "up" orientation, such that the carriers can flow more easily into the detection contact 612, the contact therefore having a relatively low resistance compared to the situation of FIG. 7. In some devices, the flow can be deviated as close to the gate electrode as possible, in order to obtain as large a the largest possible polarization ratio. In such devices, a spin can be considered dominant over a number of ranges, such as on the order of at least about 75% of the spin, at least about 55% of the spin, at least about 51% of the spin, or at least about 50.1% of the spin. The range can depend on a number of factors, such as may include the sensitivity and consistency of the device.

Figure 9:
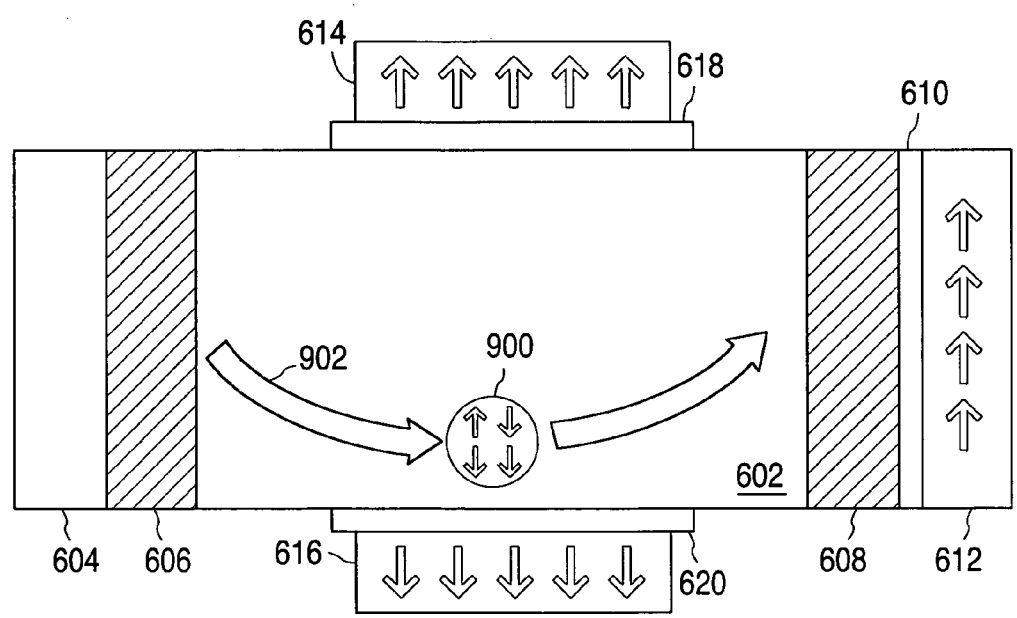
FIG. 9 is another diagram of a detection structure in accordance with the embodiment of FIG. 6.

FIG. 9 shows the device 600 with a positive gate bias being applied to gate electrode 616 and either no bias, or a negative bias, being applied to gate electrode 614, such that the current flow 902 of carriers 900 in the carrier layer 602 will tend to deviate toward gate electrode 616. The closer the carriers 900 pass to gate electrode 616, the more the carriers will tend to align spin with the electrode, which is polarized spin "down" in this example. The carriers reaching the detection electrode 612 can have an average spin polarization favoring a spin "down" orientation, such that the carriers will not flow easily into the detection contact 612, the contact therefore having a relatively high resistance compared to the situation of FIGS. 7 and 8.

Figure 10:
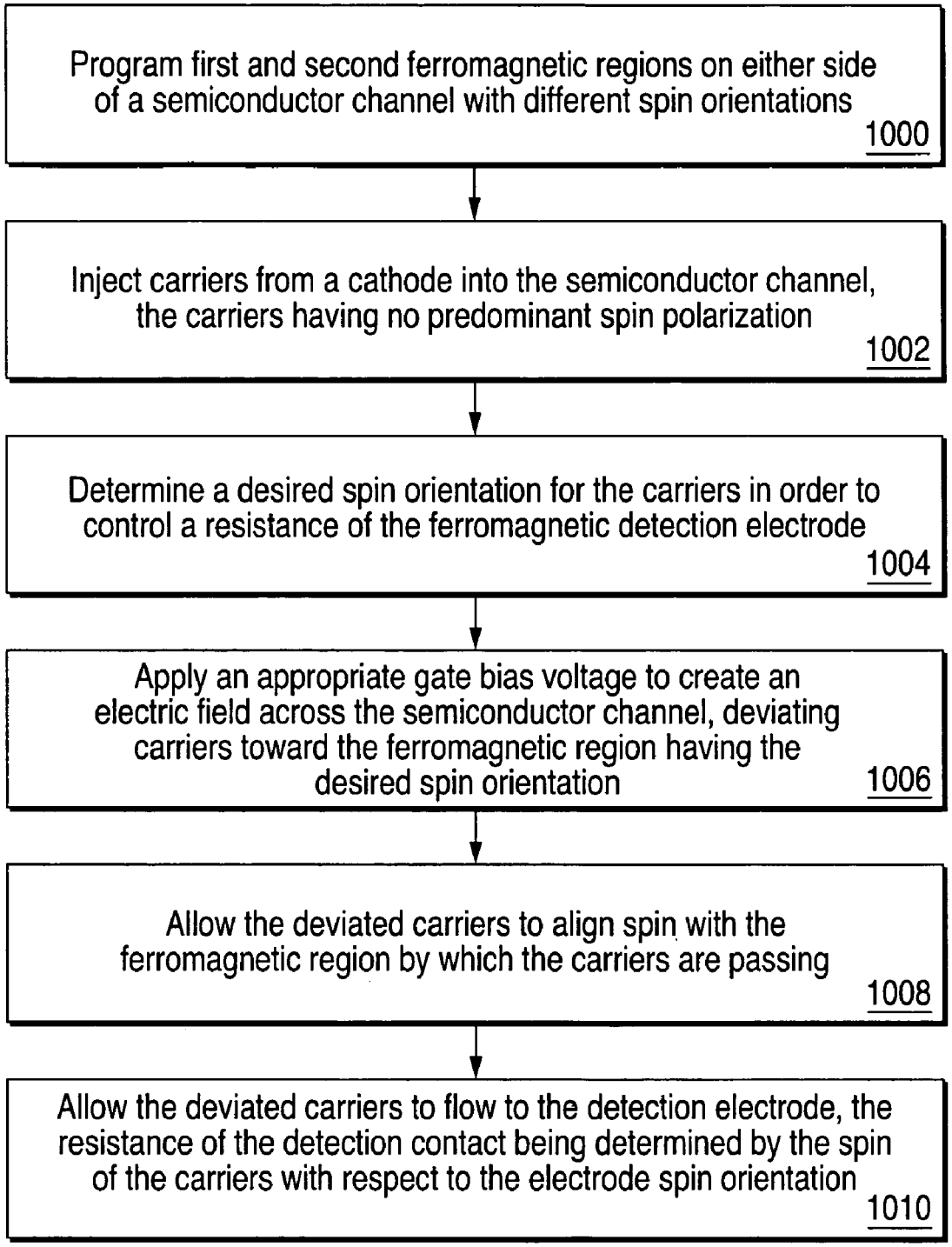
FIG. 10 is a flowchart for a process that can be used with the device of FIG. 2.

FIG. 10 shows a flowchart for an exemplary process that can be used with the device of FIGS. 2 and 3. In the process, first and second ferromagnetic regions on either side of the semiconductor channel are programmed with differing spin orientation 1000. Carriers are injected from a cathode or metal contact into the semiconductor channel, the carriers having no predominant spin polarization 1002. A desired spin polarization is determined for the carriers in order to control a resistance of the detection contact 1004. An appropriate gate bias voltage is applied to the gate electrode in order to create an electric field across the semiconductor channel, such that the flow of current in the channel is deviated toward the ferromagnetic region having the desired spin polarization 1006. The carriers following the deviated current flow are allowed to align spin with the ferromagnetic region by which the carriers are passing 1008. The spin-aligned carriers then can flow into the detection contact, the resistance of the detection contact to the current flow being determined by the spin of the carriers with respect to the spin orientation of the detection contact 1010.

Figure 11:
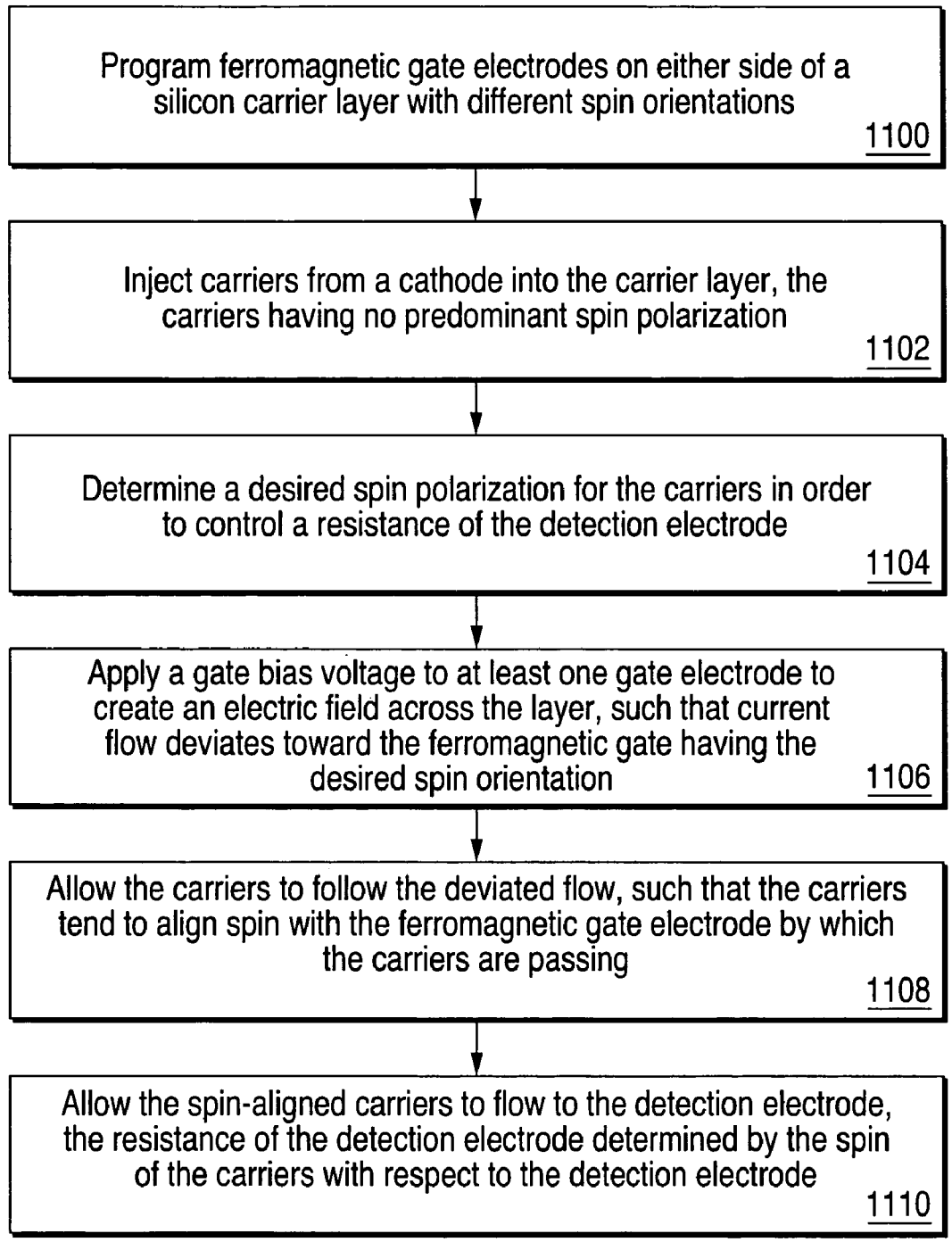
FIG. 11 is a flowchart for a process that can be used with the device of FIG. 6.

FIG. 11 shows a flowchart for an exemplary process that can be used with the device of FIG. 6. In this process, first and second ferromagnetic gate electrodes on either side of the silicon carrier layer are programmed with differing spin orientations 1100. Carriers are injected from a cathode or metal contact into the carrier layer, the carriers having no predominant spin polarization 1102. A desired spin polarization is determined for the carriers in order to control a resistance of the detection contact 1104. An appropriate gate bias voltage is applied to at least one of the ferromagnetic gate electrodes in order to create an electric field across the semiconductor channel, such that the flow of current in the channel is deviated toward the ferromagnetic gate electrode having the desired spin polarization 1106. The carriers following the deviated current flow are allowed to align spin with the ferromagnetic gate electrode by which the carriers are passing 1108. The spin-aligned carriers can then flow into the detection contact, the resistance of the detection contact to the current flow being determined by the spin of the carriers with respect to the spin orientation of the detection contact 1110.

When designing and/or manufacturing devices such as those described with respect to FIGS. 2 and 6, different materials can be tested for use in ferromagnetic contacts and/or ferromagnetic regions, as certain materials can provide enhanced functionality in certain situations and/or under certain conditions. For example, it might be advantageous in certain systems to utilize cobalt for the detection contact and ferromagnetic regions or ferromagnetic gate electrodes, as the layers might be consistently and similarly spin-polarized during the formation process. Alternatively, separate deposition, etch, and anneal processes may be used advantageously in certain devices and processes for the contact and electrodes or ferromagnetic regions, such that cobalt and nickel each can be used where appropriate if, for example, one metal should prove better for detection and the other prove better for spin coupling. Different materials also can be used where the spins of the materials are desired to be at an angled relative to the spin polarization of the contacts, in order to get the appropriate resistance from the device, where one material can easily be deposited with spins parallel to the surface boundary and one material is easily deposited with spins orthogonal to the surface boundary.

It should be recognized that a number of variations of the above-identified embodiments will be obvious to one of ordinary skill in the art in view of the foregoing description. Accordingly, the invention is not to be limited by those specific embodiments and methods of the present invention shown and described herein. Rather, the scope of the invention is to be defined by the following claims and their equivalents.

What is claimed is:

1. A system for spin-polarizing carriers in silicon, comprising:
   a first ferromagnetic region positioned adjacent to a channel in the silicon, the first ferromagnetic region having a first spin polarization; and
   a field generator positioned relative to the channel such that the field generator can apply one of an electric field and a magnetic field across the channel to selectively deviate carriers, flowing through the channel, toward the first ferromagnetic region in order to align, spins of the directed carriers with the first spin polarization of the first ferromagnetic region.

2. A system according to claim 1, further comprising:
   a source electrode positioned adjacent to the silicon and capable of injecting the carriers into the channel.

3. A system according to claim 2, wherein:
   the source electrode comprises a non-ferromagnetic metal contact.

4. A system according to claim 1, further comprising:
   a second ferromagnetic region positioned adjacent to the silicon channel, the second ferromagnetic region having a second spin polarization, the field generator being further capable of applying one of an electric field and a magnetic field across the silicon channel such that carriers flowing through the channel are directed toward a selected region of said first and second ferromagnetic regions, whereby spins of the directed carriers align with the selected region.

5. A system according to claim 1, wherein:
   the electric field generator includes a first gate electrode positioned adjacent the channel, the first gate electrode capable of receiving a first gate bias and applying a corresponding electric field across the silicon channel.

6. A system according to claim 5, wherein:
   the electric field generator further includes a second gate electrode positioned adjacent the channel and opposite the first gate electrode, the second gate electrode capable of receiving a second gate bias and applying a corresponding electric field across the silicon channel in conjunction with said first gate electrode.

7. A system according to claim 1, wherein:
   the electric field generator includes at least one device selected from the group consisting of internal magnetic field generators, external magnetic field generators, nanowires, and light sources.

8. A system for spin-polarizing carriers in silicon, comprising:
   a first ferromagnetic region positioned adjacent to a channel in the silicon, the first ferromagnetic region having a first spin polarization; and
   a field generator positioned relative to the channel such that the field generator can apply one of an electric field and a magnetic field across the channel, whereby carriers flowing through the channel are directed toward the first ferromagnetic region, and spins of the directed carriers align with the first spin polarization of the first ferromagnetic region;
   wherein the first ferromagnetic region is at least partially contained within at least one of the channel and the silicon.

9. A system according to claim 1, further comprising:
   a ferromagnetic drain electrode positioned at an end of the channel and capable of receiving spin-aligned carriers from the channel.

10. A system for spin-polarizing carriers in silicon, comprising:
    a first ferromagnetic region positioned adjacent to a channel in the silicon, the first ferromagnetic region having a first spin polarization;
    a field generator positioned relative to the channel such that the field generator can apply one of an electric field and a magnetic field across the channel, whereby carriers flowing through the channel are directed toward the first ferromagnetic region, and spins of the directed carriers align with the first spin polarization of the first ferromagnetic region; and
    a ferromagnetic drain electrode positioned at an end of the channel and capable of receiving spin-aligned carriers from the channel, the ferromagnetic drain electrode having a drain spin polarization, and the resistance of the ferromagnetic drain electrode to the spin-aligned carriers depends upon the spin polarization of the spin-aligned carriers relative to the drain spin polarization.

11. A system according to claim 1, further comprising:
    a ferromagnetic drain electrode capable of receiving the carriers injected into the channel, the ferromagnetic drain electrode having the first spin polarization such that carriers with spins aligned to said first spin polarization flow into said ferromagnetic drain electrode, and carriers with spins aligned to said second spin polarization are substantially inhibited from flowing into said ferromagnetic drain electrode.

12. A system according to claim 1, further comprising:
    an interface region between the silicon and the first ferromagnetic region.

13. A system for spin-polarizing carriers in silicon, comprising:

a first ferromagnetic region positioned adjacent to a channel in the silicon, the first ferromagnetic region having a first spin polarization;

a field generator positioned relative to the channel such that the field generator can apply one of an electric field and a magnetic field across the channel, whereby carriers flowing through the channel are directed toward the first ferromagnetic region, and spins of the directed carriers align with the first spin polarization of the first ferromagnetic region; and an external magnetic field generator capable of applying a magnetic field across the first ferromagnetic region in order to control the first spin polarization of the first ferromagnetic region.

14. A spin-based transistor, comprising:

a silicon substrate including a carrier channel;

a source electrode positioned near a first end of the carrier channel and being capable of injecting carriers into the carrier channel;

first and second ferromagnetic regions positioned on opposing sides of the silicon channel, the first ferromagnetic region having a first spin polarization and the second ferromagnetic region having a second spin polarization;

a ferromagnetic drain electrode positioned near a second end of the carrier channel and being capable of receiving the carriers injected into the channel, the ferromagnetic drain electrode having the first spin polarization; and a gate electrode positioned adjacent the silicon channel between the source and drain electrodes, the gate electrode capable of receiving a gate bias and applying a corresponding electric field across the silicon channel such that carriers flowing through the channel can be directed toward a selected one of said first and second ferromagnetic regions, whereby the spin of a directed carrier aligns with the spin of the selected ferromagnetic region such that carriers with spins aligned to said first spin polarization flow into said ferromagnetic drain electrode, and carriers with spins aligned to said second spin polarization are substantially inhibited from flowing into said ferromagnetic drain electrode.

15. A method for spin-polarizing carriers in a semiconductor channel on a silicon substrate, comprising:

injecting a carrier into the semiconductor channel, the carrier having a random spin orientation;

determining a desired spin orientation for the carrier; and applying one of an electric field and a magnetic field across the semiconductor channel in order to selectively deviate the carrier towards a ferromagnetic region having the desired spin orientation, such that when the carrier passes by the ferromagnetic region the random spin orientation of the carrier aligns with the desired spin orientation of the ferromagnetic region.

16. A method according to claim 15, wherein:

applying one of an electric field and a magnetic field includes applying a bias voltage to at least one gate electrode adjacent the semiconductor channel in order to apply an electric field across the semiconductor channel.

17. A method according to claim 15, wherein:

applying one of an electric field and a magnetic field includes using a device selected from the group consisting of internal magnetic field generators, external magnetic field generators, nanowires, and light sources.

18. A method for spin-polarizing carriers in a semiconductor channel on a silicon substrate, comprising:

injecting a carrier into the semiconductor channel, the carrier having a random spin orientation;

determining a desired spin orientation for the carrier;

applying one of an electric field and a magnetic field across the semiconductor channel in order to deviate the carrier towards a ferromagnetic region having the desired spin orientation, such that when the carrier passes by the ferromagnetic region the random spin orientation of the carrier aligns with the desired spin orientation of the ferromagnetic region; and detecting the carrier in the semiconductor channel using a ferromagnetic drain electrode, the ferromagnetic drain electrode having a drain spin orientation such that when the desired spin orientation of the carrier aligns with the drain spin orientation the carrier flows into said ferromagnetic drain electrode, and when the desired spin orientation of the carrier does not align with the drain spin orientation the carrier is substantially inhibited from flowing into said ferromagnetic drain electrode.

19. A method for spin-polarizing carriers in a semiconductor channel on a silicon substrate, comprising:

injecting a carrier into the semiconductor channel, the carrier having a random spin orientation;

determining a desired spin orientation for the carrier;

applying one of an electric field and a magnetic field across the semiconductor channel in order to deviate the carrier towards a ferromagnetic region having the desired spin orientation, such that when the carrier passes by the ferromagnetic region the random spin orientation of the carrier aligns with the desired spin orientation of the ferromagnetic region; and applying an external magnetic field in order to control a region spin-polarization of the ferromagnetic region.

20. A method for spin-polarizing carriers in a semiconductor channel on a silicon substrate, comprising:

injecting a carrier into the semiconductor channel, the carrier having a random spin orientation;

determining a desired spin orientation for the carrier;

applying one of an electric field and a magnetic field across the semiconductor channel in order to deviate the carrier towards a ferromagnetic region having the desired spin orientation, such that when the carrier passes by the ferromagnetic region the random spin orientation of the carrier aligns with the desired spin orientation of the ferromagnetic region; and controlling the thickness of the ferromagnetic region in order to control a region spin-polarization of the ferromagnetic region.

* * * * *